(12) United States Patent
Kakinuma

(10) Patent No.: US 11,651,989 B2
(45) Date of Patent: May 16, 2023

(54) WAFER TRANSFERRING METHOD

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/821,585

(22) Filed: Aug. 23, 2022

(65) Prior Publication Data

US 2023/0073694 A1    Mar. 9, 2023

(30) Foreign Application Priority Data

Sep. 6, 2021   (JP) .............................. JP2021-144439

(51) Int. Cl.
| | | |
|---|---|---|
| B29C 65/00 | (2006.01) | |
| H01L 21/683 | (2006.01) | |
| H01L 21/78 | (2006.01) | |
| B29C 65/74 | (2006.01) | |
| B29C 65/50 | (2006.01) | |
| B32B 43/00 | (2006.01) | |

(52) U.S. Cl.
CPC .......... *H01L 21/6836* (2013.01); *H01L 21/78* (2013.01); *B29C 65/50* (2013.01); *B29C 65/74* (2013.01); *B32B 43/006* (2013.01); *H01L 21/6838* (2013.01); *H01L 2221/68327* (2013.01); *H01L 2221/68386* (2013.01); *Y10T 156/1158* (2015.01); *Y10T 156/1917* (2015.01)

(58) Field of Classification Search
CPC ............... H01L 21/6838; B32B 43/006; Y10T 156/1158; Y10T 156/1917; B29C 65/50; B29C 65/74
See application file for complete search history.

(56) References Cited

U.S. PATENT DOCUMENTS

2011/0097875 A1*   4/2011   Gokita .................... H01L 21/78
                                                       257/E21.599

FOREIGN PATENT DOCUMENTS

| JP | 2002192370 A | 7/2002 |
| JP | 2017162870 A | 9/2017 |

* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A wafer is positioned in an opening of a first frame. The wafer is pressure-bonded at one surface thereof to a first tape together with the first frame, onto a second tape pressure-bonded to a second frame. The wafer is processed by pressure-bonding the second tape, which is pressure-bonded to the second frame having an outer diameter smaller than an inner diameter of the opening of the first frame, to another surface of the wafer, cutting the first tape along an outer periphery of the second frame, imparting an external stimulus to the first tape to lower a pressure-bonding force with which the first tape is pressure-bonded to the one surface of the wafer, and peeling off the first tape from the one surface of the wafer pressure-bonded to the second tape.

3 Claims, 6 Drawing Sheets

WAFER TRANSFERRING METHOD

BACKGROUND OF THE INVENTION

Field of the Invention

The present invention relates to a wafer transferring method for transferring a wafer having one surface pressure-bonded to a first tape together with a first frame, onto a second tape pressure-bonded to a second frame.

Description of the Related Art

A wafer formed on a front surface thereof with a plurality of devices such as integrated circuits (ICs) and large scale integration (LSI) circuits in the state of being partitioned by a plurality of intersecting projected dicing lines is divided by a dicing apparatus into individual device chips, and the resulting device chips are used for electric appliances such as mobile phones and personal computers.

In addition, there has been proposed a technology in which a tape is attached to a front surface of a wafer to hold the wafer on a chuck table, a laser beam of such a wavelength as to be transmitted through the wafer is applied to the wafer from a back surface of the wafer with a focal point of the laser beam positioned inside the wafer along projected dicing lines to form modified layers inside the wafer, and an external force is exerted on the wafer to divide the wafer into individual device chips with the modified layers as division starting points (see, for example, Japanese Patent No. 3408805).

Incidentally, when the individual device chips are to be picked up from the tape, the wafer has to be put into a state in which a tape is attached to the back surface of the wafer and the front surface of the wafer is exposed, and in view of this, a technology of transferring the wafer from one tape onto another tape and exposing the front surface of the wafer has been proposed (see, for example, Japanese Patent No. 6695173).

SUMMARY OF THE INVENTION

In implementing the technology disclosed in Japanese Patent No. 6695173, the tape attached to the wafer has to be cut along an outer diameter of the wafer, and in some cases, the wafer may be damaged.

Accordingly, it is an object of the present invention to provide a wafer transferring method capable of transferring a wafer from one tape onto another tape without damaging the wafer.

In accordance with an aspect of the present invention, there is provided a wafer transferring method for transferring a wafer that is positioned in an opening of a first frame having the opening for accommodating the wafer and is pressure-bonded at one surface thereof to a first tape together with the first frame, onto a second tape pressure-bonded to a second frame. The wafer transferring method includes a second tape pressure-bonding step of pressure-bonding the second tape pressure-bonded to the second frame having an outer diameter smaller than an inner diameter of the opening of the first frame, to another surface of the wafer, a first tape cutting step of cutting the first tape along an outer periphery of the second frame, a pressure-bonding force lowering step of imparting an external stimulus to the first tape to lower a pressure-bonding force with which the first tape is pressure-bonded to the one surface of the wafer, and a peeling step of peeling off the first tape from the one surface of the wafer pressure-bonded to the second tape.

Preferably, the pressure-bonding force lowering step is carried out before the second tape pressure-bonding step. Preferably, the first tape is an ultraviolet (UV) curing type tape, and the pressure-bonding force lowering is carried out by applying ultraviolet rays to the first tape.

According to the wafer transferring method of the present invention, a wafer can be transferred from a first tape onto a second tape without being damaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A wafer transferring method according to an embodiment of the present invention will be described in detail below with reference to the attached drawings. The wafer transferring method according to the embodiment described below is carried out, for example, after a tape is attached to a front surface of a wafer, the wafer is held on a chuck table, and a laser beam of such a wavelength as to be transmitted through the wafer is applied to the wafer from a back surface of the wafer with a focal point of the laser beam positioned inside the wafer along projected dicing lines to thereby form modified layers. The wafer transferring method of the present invention is then carried out, and the front surface of the water is exposed upward. Thereafter, an external force is exerted on the wafer to divide the wafer into individual device chips, after which a pick-up step is carried out.

Figure 1:
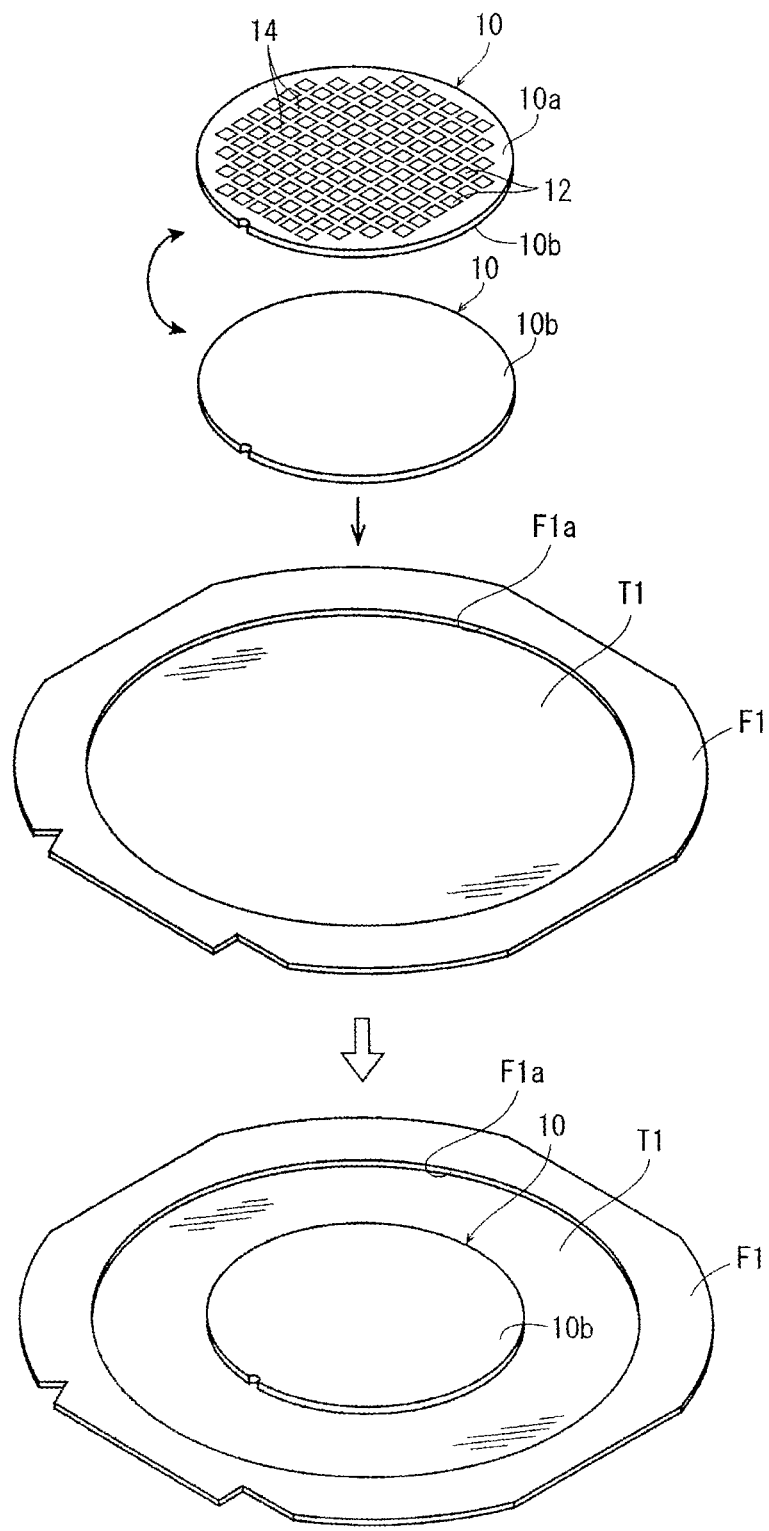
FIG. 1 is a perspective view depicting a manner in which a wafer as a workpiece in an embodiment, a first frame, and a first tape are integrated.

FIG. 1 illustrates a semiconductor wafer 10 as a workpiece in the present embodiment. The wafer 10 is formed on its front surface 10a with a plurality of devices 12 in the state of being partitioned by a plurality of intersecting projected dicing lines 14.

Besides the wafer 10 described above, as depicted in FIG. 1, an annular first frame F1 having an opening F1a capable of accommodating the wafer 10 and a first tape T1 having an adhesive layer on a front surface thereof are prepared. The wafer 10 is positioned at a center of the opening F1a in such a manner that one surface, or the front surface 10a, of the wafer 10 faces downward and another surface, or a back surface 10b, of the wafer 10 faces upward. The front surface 10a of the wafer 10 is pressure-bonded to the first tape T1 together with the first frame F1, so that the wafer 10 is held by the first frame F1 through the first tape T1 as depicted in a bottom part of FIG. 1.

Figure 2A:
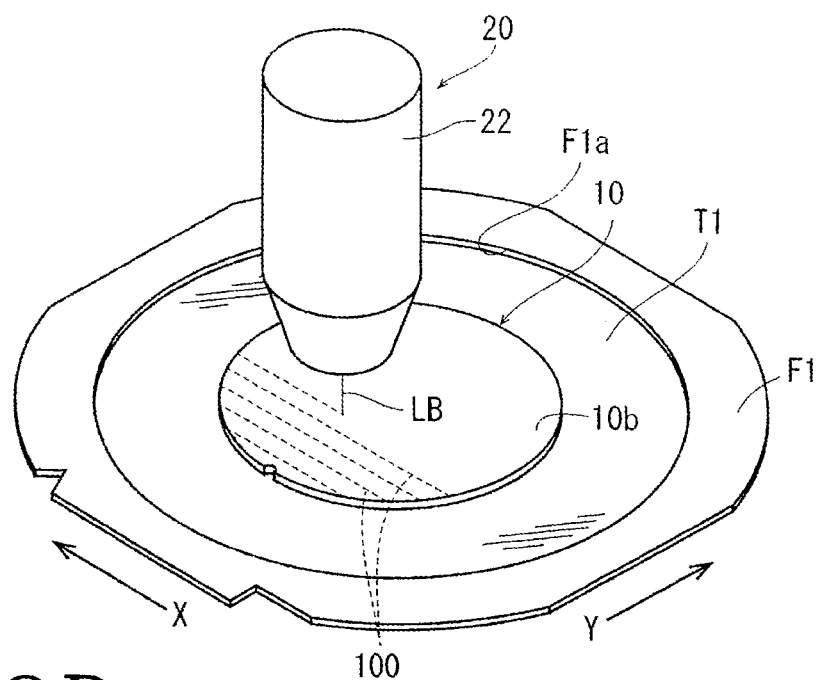
FIG. 2A is a perspective view depicting a manner of carrying out laser processing for forming modified layers inside the wafer along projected dicing lines.

After the wafer 10 is held by the first frame F1 as described above, the wafer 10 is conveyed to a laser processing apparatus 20 depicted in FIG. 2A (only part thereof is illustrated). The laser processing apparatus 20 includes a chuck table not illustrated and a light concentrator 22 of a laser beam applying unit for applying a laser beam LB of such a wavelength as to be transmitted through the wafer 10. The chuck table includes an X-axis feeding mechanism for processing-feeding the chuck table and the light concentrator 22 relative to each other in an X-axis direction, a Y-axis feeding mechanism for processing-feeding the chuck table and the light concentrator 22 relative to each other in a Y-axis direction orthogonal to the X-axis direction, and a rotational drive mechanism for rotating the chuck table (illustration of these mechanisms are omitted).

The wafer 10 conveyed to the laser processing apparatus 20 is held under suction on the chuck table in such a manner that the back surface 10b of the wafer 10 faces upward. The wafer 10 held on the chuck table is subjected to an alignment step by use of alignment means (omitted in illustration) having an infrared imaging element capable of imaging reflected light of infrared rays that are applied to the wafer 10 and are transmitted from the back surface 10b of the wafer 10, so that the position of a predetermined one of the projected dicing lines 14 formed on the front surface 10a is detected, and the wafer 10 is rotated by the rotational drive mechanism to align the projected dicing lines 14 extending in a first direction with the X-axis direction. Information regarding the detected position of the projected dicing line 14 is stored in control means not illustrated.

Based on the positional information regarding the projected dicing line 14 detected by the alignment step, the light concentrator 22 of the laser applying unit is positioned at a processing start position of the projected dicing line 14 extending in the first direction, and the laser beam LB is applied from the back surface 10b of the wafer 10 with a focal point of the laser beam LB positioned inside the wafer 10 at a position corresponding to the projected dicing line 14 while, at the same time, the wafer 10 is processing-fed in the X-axis direction together with the chuck table, so that a modified layer 100 is formed along the predetermined projected dicing line 14 extending in the first direction of the wafer 100. After the modified layer 100 is formed along the predetermined projected dicing line 14, the wafer 10 is indexing-fed in the Y-axis direction by an interval of the projected dicing lines 14, to thereby position, directly below the light concentrator 22, an unprocessed projected dicing line 14 extending in the first direction which line is adjacent to the predetermined projected dicing line 14 in the Y-axis direction. Then, similarly to the manner described above, the laser beam LB is applied to the wafer 10 with the focal point of the laser beam LB positioned inside the wafer 10 at a position corresponding to the projected dicing line 14 while, at the same time, the wafer 10 is processing-fed in the X-axis direction, to form a modified layer 100. By repeating these operations, the modified layers 100 are formed along all the projected dicing lines 14 extending in the first direction. Note that the modified layers 100 are formed inside the wafer 10 along the projected dicing lines 14 and cannot visually be recognized in practice, but in the description with reference to FIGS. 2A and 2B and the subsequent drawings, the modified layers 100 are indicated by broken lines for the convenience of explanation.

Figure 2B:
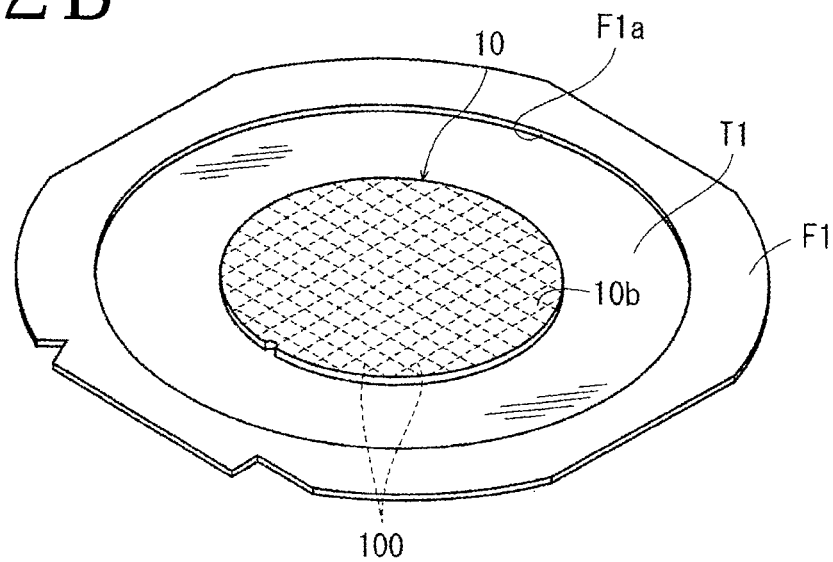
FIG. 2B is a perspective view depicting a state in which modified layers have been formed in the wafer.

Next, the wafer 10 is rotated by 90 degrees, and the projected dicing lines 14 that extend in a second direction and are orthogonal to the projected dicing lines 14 extending in the first direction, for which the modified layers 100 have already been formed, are aligned with the X-axis direction. Then, the laser beam LB is applied with the focal point positioned inside the wafer 10 along each of the projected dicing lines 14 extending in the second direction, similarly to the manner described above. The modified layers 100 are thus formed along all the projected dicing lines 14 formed on the front surface 10a of the wafer 10 as depicted in FIG. 2B. After the laser processing is carried out in this manner, subsequently, in order to prepare for a pick-up step after the division of the wafer 10 into individual device chips, the wafer transferring method according to the present embodiment is carried out. Note that the processing of the wafer 10 suitable for application of the wafer transferring method of the present invention is not limited to the laser processing described above and may be, for example, cutting processing carried out using a dicing apparatus 30 depicted in FIG. 3. The cutting processing is now described with reference to FIG. 3.

Figure 3:
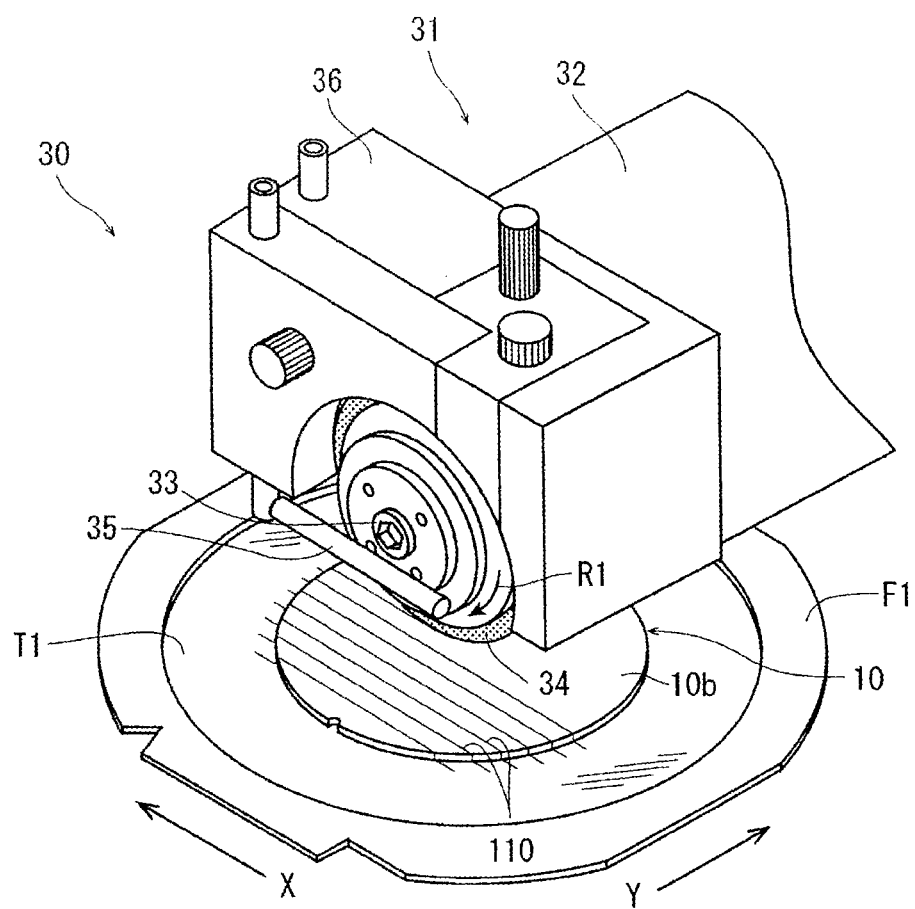
FIG. 3 is a perspective view depicting a manner of carrying out cutting processing.

The wafer 10 held by the first frame F1 through the first tape T1 as described based on FIG. 1 is conveyed to the dicing apparatus 30 depicted in FIG. 3 (only part thereof is illustrated).

The dicing apparatus 30 includes a chuck table (omitted in illustration) that holds the wafer 10 under suction and a cutting unit 31 that cuts the wafer 10 held under suction on the chuck table. The chuck table is configured to be rotatable and includes a moving mechanism (omitted in illustration) that processing-feeds the chuck table in a direction indicated by an arrow X in the figure. In addition, the cutting unit 31 includes a spindle 33 rotatably held by a spindle housing 32 that is disposed in the Y-axis direction indicated by an arrow Y in the figure, an annular cutting blade 34 held at a tip of the spindle 33, a cutting water nozzle 35 that supplies cutting water to a cutting area, a blade cover 36 that covers the cutting blade 34, and a Y-axis moving mechanism (omitted in illustration) that indexing-feeds the cutting blade 34 in the Y-axis direction. The cutting blade 34 held at the tip of the spindle 33 is driven to rotate in a direction indicated by an arrow R1 by a spindle motor omitted in illustration.

When a dividing step of dividing the wafer 10 into individual device chips with use of the cutting blade 34 described above is to be carried out, first, the wafer 10 is placed and held under suction on the chuck table of the dicing apparatus 30 in such a manner that the back surface 10b of the wafer 10 faces upward, and alignment similar to the above-described alignment step is carried out to align the projected dicing lines 14 extending in the first direction of the wafer 10 with the X-axis direction. Next, the cutting blade 34 rotating at a high speed is made to cut into the wafer 10 from the back surface 10b side along one of the projected dicing lines 14 aligned with the X-axis direction while, at the same time, the chuck table is processing-fed in the X-axis direction, to thereby form a division groove 110 for breaking the wafer 10 along the projected dicing line 14. Further, the cutting blade 34 is indexing-fed onto an unprocessed projected dicing line 14 which is adjacent in the Y-axis direction to the projected dicing line 14 having been formed with the division groove 110 and which is not yet formed with a division groove 110, to form a division groove 110 similar to that described above. By repeating these operations, the division grooves 110 are formed along all the projected dicing lines 14 extending in the first direction.

The wafer 10 is then rotated by 90 degrees to align the projected dicing lines 14 extending in the second direction orthogonal to the first direction, in which the division grooves 110 have already been formed, with the x-axis direction, and the above-described cutting processing is carried out for all the projected dicing lines 14 extending in the second direction. The division grooves 110 are thus formed along all the projected dicing lines 14 formed on the wafer 10. After the cutting processing is carried out in this manner and the wafer 10 is divided along the projected dicing lines 14 into device chips each having one device 12 formed thereon, the wafer transferring method described below is carried out. Note that, in the embodiment of the wafer transferring method described below, description will be made on the assumption that the laser processing described above has been carried out on the wafer 10.

Figure 4:
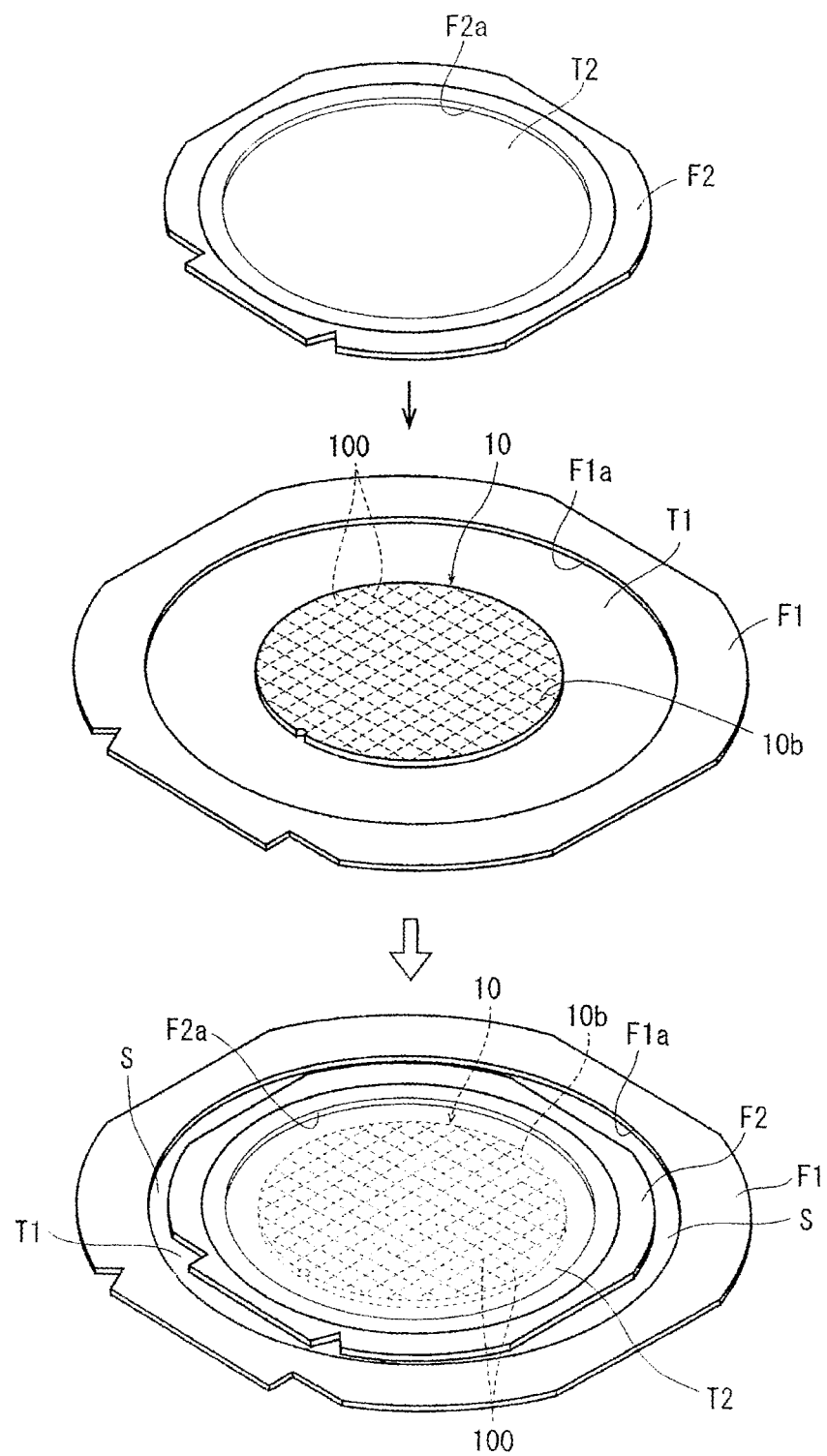
FIG. 4 is a perspective view depicting a manner of carrying out a first tape pressure-bonding step.

The wafer 10 having undergone the above-described laser processing is obtained by positioning the wafer 10 in the opening F1a of the first frame F1 having the opening F1a for accommodating the wafer 10 and pressure-bonding one surface (the front surface 10a) of the wafer 10 to the first tape T1 together with the first frame F1 as described above. Meanwhile, as depicted in FIG. 4, a frame set in which a second tape T2 is pressure-bonded to a second frame F2 having an outer diameter smaller than an inner diameter of the opening F1a of the first frame F1 is prepared. Note that the second frame F2 has an opening F2a capable of accommodating the wafer 10.

After the frame set described above is prepared, the second frame F2 is positioned in and placed on a region of the first tape T1 located between the first frame F1 and the wafer 10 in such a manner that a back surface of the second frame F2 to which the second tape T2 is pressure-bonded faces upward and a front surface of the second frame F2 formed with an adhesive layer faces downward, as depicted in a bottom part of FIG. 4, and the second tape T2 is pressure-bonded to the other surface, or the back surface 10b, of the wafer 10 (second tape pressure-bonding step). To carry out the second tape pressure-bonding step, a pressure-bonding roller not illustrated may be used. As depicted in FIG. 4, a space S is defined between an outer periphery of the second frame F2 and the opening F1a of the first frame F1.

Figure 5:
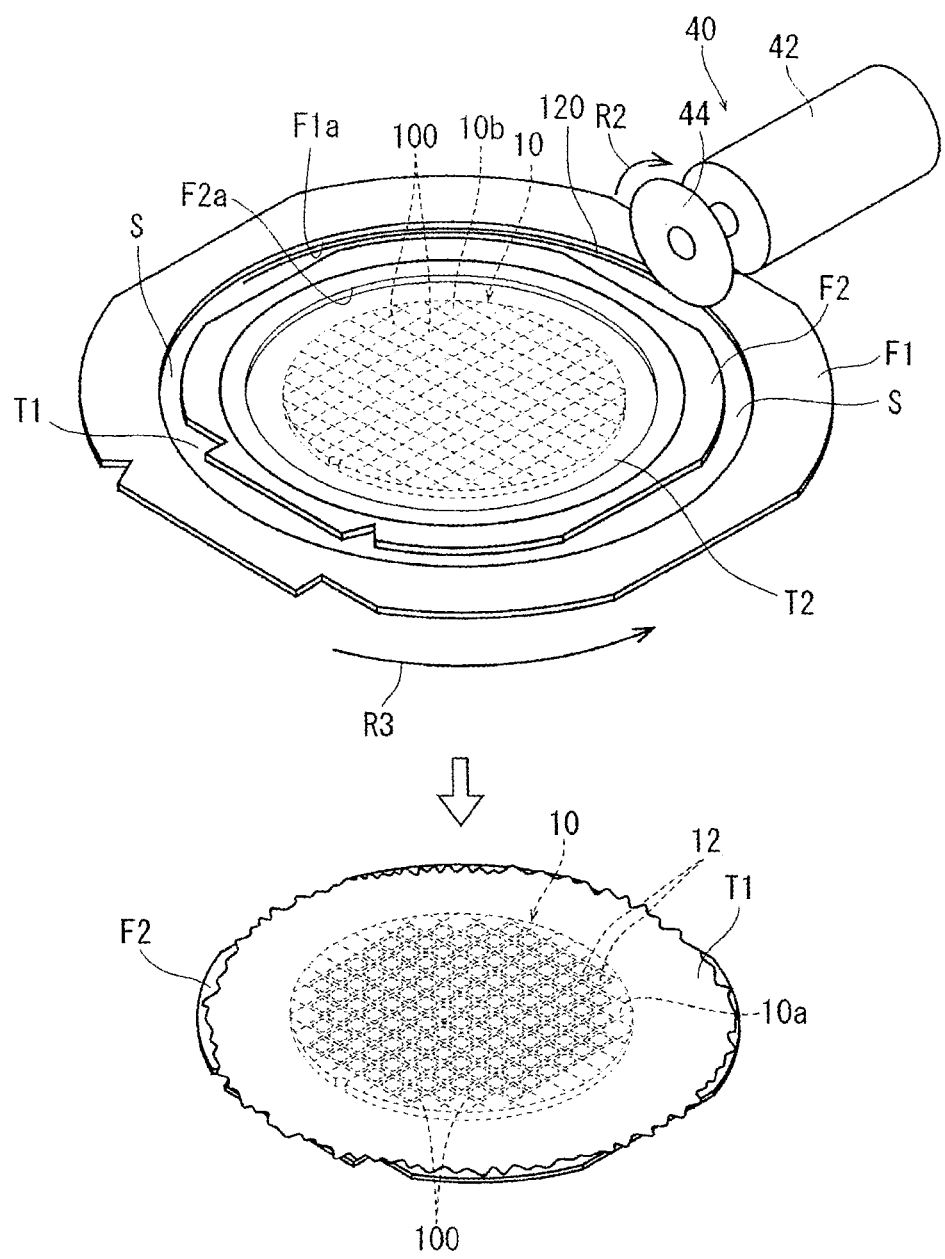
FIG. 5 is a perspective view depicting a manner of carrying out a first tape cutting step.

After the second tape pressure-bonding step is carried out in this manner, a blade cutter 40 depicted in FIG. 5 is prepared. The blade cutter 40 includes a cutting blade 44 driven to rotate by a rotational motor 42, and the cutting blade 44 is rotated in a direction indicated by an arrow R2. With the blade cutter 40 prepared, while the first frame F1 is rotated in a direction indicated by an arrow R3, the cutting blade 44 is positioned in the space S defined between the opening F1a of the first frame F1 and the outer periphery of the second frame F2 to carry out cutting, thereby forming an annular cutting line 120. The first tape T1 is thus cut along the outer periphery of the second frame F2 (first tape cutting step). Note that the method for cutting the first tape T1 along the outer periphery of the second frame F2 is not limited to this, and the cutting may be carried out by another method.

Figure 6:
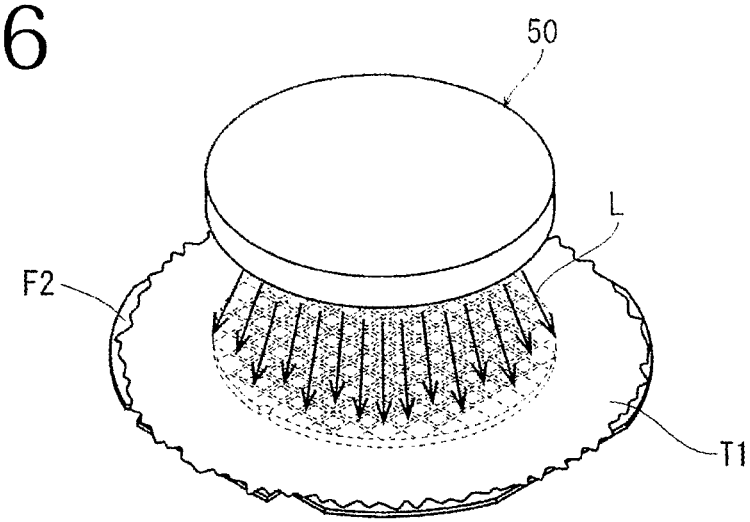
FIG. 6 is a perspective view depicting a manner of carrying out a pressure-bonding force lowering step.

After the first tape T1 is cut by the first tape cutting step as described above, the first frame F1 and a peripheral part of the first tape T1 are removed, and the second frame F2 is turned over in such a manner that the first tape T1 having a remaining central region pressure-bonded to the wafer 10 faces upward as depicted in a lower part of FIG. 5. Then, in order to carry out a pressure-bonding force lowering step of lowering a pressure-bonding force of the first tape T1 by imparting an external stimulus to the first tape T1, UV applying means 50 is positioned above the first tape T1 as depicted in FIG. 6, and UV rays L are applied from the UV applying means 50 to the first tape T1. The UV rays L serve as an external stimulus, and the pressure-bonding force of the first tape T1 to which the wafer 10 is pressure-bonded is lowered (pressure-bonding force lowering step).

Figure 7:
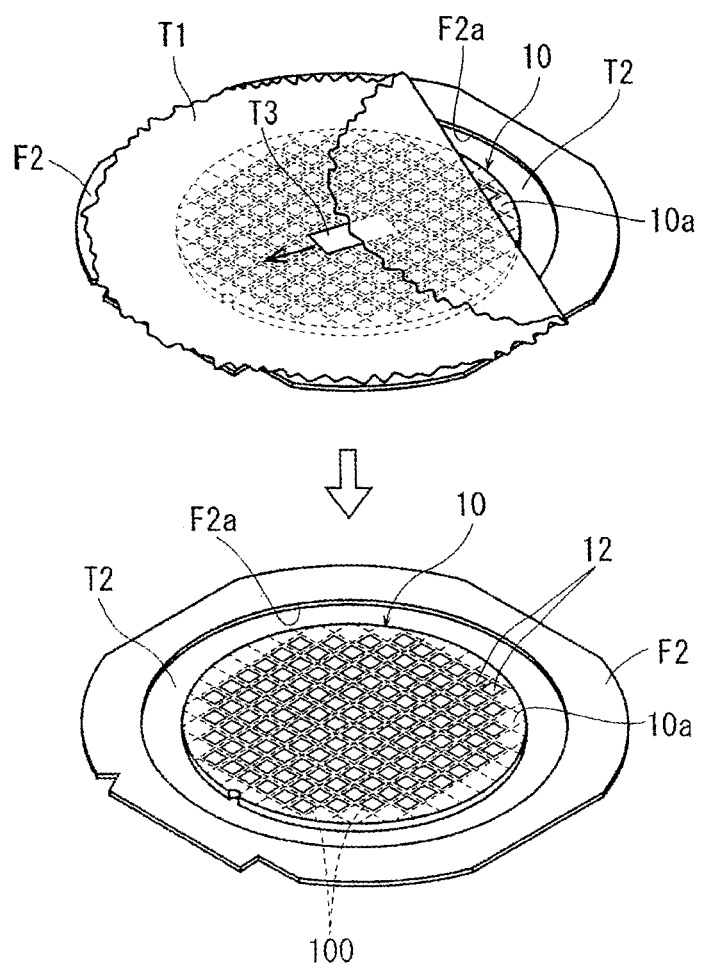
FIG. 7 is a perspective view depicting a manner of carrying out a peeling step.

After the pressure-bonding force lowering step is carried out, the first tape T1 lowered in pressure-bonding force is peeled off from the front surface 10a of the wafer 10 pressure-bonded to the second tape T2 (peeling step) as depicted in an upper part of FIG. 7. In carrying out the peeling step, as depicted in the figure, a peeling tape T3 is attached to a peripheral part of the first tape T1, and the tape T3 is pulled in a horizontal direction to thereby achieve peeling. As a result, as depicted in a lower part of FIG. 7, the first tape T1 is removed from the front surface 10a of the wafer 10, so that the wafer transferring method of the present embodiment is completed. Note that, while an example (FIG. 6) in which the application of UV rays L as means for imparting an external stimulus is carried out from an upper side is described in the above embodiment, it is preferable that the external stimulus be applied from a lower side in a state in which the first tape T1 faces downward to thereby lower the pressure-bonding force and that the first tape T1 be removed in the state of facing downward, because the first tape T1 would not adhere to the second tape T2. As a result, the wafer 10 can be transferred from the first tape T1 onto the second tape T2 without damaging the wafer 10, and one surface, or the front surface 10a, of the wafer 10 is now exposed, which is suitable for the subsequent pick-up step.

As described above, after the wafer 10 is transferred from the first tape T1 onto the second tape T2 and the one surface, or the front surface 10a, of the wafer 10 is exposed, it is possible to divide, by exerting an external force on the wafer 10, the wafer 10 into individual device chips with the modified layers 100 as division starting points, and thereafter to carry out the pick-up step.

Note that, while the pressure-bonding force lowering step is carried out after the first tape cutting step is carried out in the above embodiment, the present invention is not limited to this. For example, the pressure-bonding force lowering step may be performed before the second tape pressure-bonding step is carried out.

In addition, while the external stimulus in the pressure-bonding force lowering step is given by application of UV rays in the above embodiment, the present invention is not limited to this. For example, an external stimulus may be given by heating or cooling, to thereby lower the pressure-bonding force of the first tape T1. The selection of the external stimulus is determined as appropriate according to the material of the first tape T1.

Further, while the above embodiment has been described on the assumption that an adhesive layer is formed on the front surface of the first tape T1 and on a front surface of the second tape T2, the present invention is not limited to this. As the first tape T1 and the second tape T2 that do not have an adhesive layer, a thermocompression bonding tape made of a polyolefin- or polyester-based material that exhibits an adhesive force when heated may be used.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer transferring method for transferring a wafer that is positioned in an opening of a first frame having the opening for accommodating the wafer and is pressure-bonded at one surface thereof to a first tape together with the first frame, onto a second tape pressure-bonded to a second frame, the wafer transferring method comprising:
   a second tape pressure-bonding step of pressure-bonding the second tape pressure-bonded to the second frame having an outer diameter smaller than an inner diameter of the opening of the first frame, to another surface of the wafer;
   a first tape cutting step of cutting the first tape along an outer periphery of the second frame;
   a pressure-bonding force lowering step of imparting an external stimulus to the first tape to lower a pressure-bonding force with which the first tape is pressure-bonded to the one surface of the wafer; and
   a peeling step of peeling off the first tape from the one surface of the wafer pressure-bonded to the second tape.

2. The wafer transferring method according to claim 1, wherein the pressure-bonding force lowering step is carried out before the second tape pressure-bonding step.

3. The wafer transferring method according to claim 1, wherein the first tape is an ultraviolet curing type tape, and the pressure-bonding force lowering is carried out by applying ultraviolet rays to the first tape.

* * * * *